United States Patent
Erickson et al.

(10) Patent No.: US 6,862,172 B2
(45) Date of Patent: Mar. 1, 2005

(54) HINGED MOUNTING FOR MULTIPLE STORAGE DRIVES

(75) Inventors: Vernon D. Erickson, Dakota Dunes, SD (US); David R. Davis, Jefferson, SD (US); Thomas R. Carson, South Sioux City, NE (US); Robert S. Williams, El Paso, TX (US); Alejandro Puentes, El Paso, TX (US)

(73) Assignee: Gateway, Inc., Irvine, CA (US)

( * ) Notice: Subject to any disclaimer, the term of this patent is extended or adjusted under 35 U.S.C. 154(b) by 0 days.

(21) Appl. No.: 10/086,518

(22) Filed: Feb. 28, 2002

(65) Prior Publication Data

US 2002/0085347 A1 Jul. 4, 2002

Related U.S. Application Data

(63) Continuation of application No. 09/752,665, filed on Dec. 28, 2000, now Pat. No. 6,392,875.

(51) Int. Cl.$^7$ .............................................. G06F 1/16
(52) U.S. Cl. ................... 361/685; 312/330.1; 248/300
(58) Field of Search ................... 361/683–685, 361/724, 752, 753, 775; 312/223.1, 223.2, 330.1; 248/300; G06F 1/16

(56) References Cited

U.S. PATENT DOCUMENTS

| | | | | |
|---|---|---|---|---|
| 5,561,893 A | * | 10/1996 | Lee | 361/683 |
| 5,701,231 A | * | 12/1997 | Do et al. | 361/683 |
| 5,774,330 A | * | 6/1998 | Melton et al. | 361/683 |
| 5,774,337 A | * | 6/1998 | Lee et al. | 361/725 |
| 5,784,251 A | * | 7/1998 | Miller et al. | 361/683 |
| 5,995,364 A | * | 11/1999 | McAnally et al. | 361/685 |
| 6,404,625 B1 | * | 6/2002 | Chen et al. | 361/683 |

* cited by examiner

*Primary Examiner*—Lisa Lea-Edmonds
(74) *Attorney, Agent, or Firm*—Jeffrey A. Proehl; Leonard & Proehl

(57) ABSTRACT

A mounting mechanism for multiple computer storage drives mounts at least one drive so that it may be swung out for easy access to the drive and to its cable connectors. The mechanism comprises a drive cage mounting bracket, a hinge, and appropriately adapted chassis, so that the mounting bracket is hingeably connected to the chassis to swing open for access and to swing closed for operation. The bracket is adapted so that, when in the open position, the cable connector of at least one mounted drive is distal from the hinge and chassis and thus easily accessible. A preferred embodiment provides for releaseably locking the bracket in the closed position. Furthermore, the bracket preferably mounts a hard drive so that it is suspended within the airspace above the computer motherboard for easier cooling.

14 Claims, 5 Drawing Sheets

HINGED MOUNTING FOR MULTIPLE STORAGE DRIVES

This application is a continuation of application Ser. No. 09/752,665, filed Dec. 28, 2000 now U.S. Pat. No. 6,392,875.

BACKGROUND OF THE INVENTION

1. Field of the Invention

This disclosure relates to computer disk drives generally, and more particularly to methods of hingedly mounting disk drives within a computer system.

2. Description of the Related Art

In the past, installation, maintenance and upgrading of storage drives either in desktop personal computers or in rack mountable systems in a central location has often posed difficulties because of the mounting arrangement used and limited space available for accessing connectors and other components of storage drives. This makes access to them difficult in most cases due to the presence of power supplies, boards, other external drives, and other various sheet metal and other plastic parts. Indeed, in systems where multiple drives are installed, access to one drive may be considerably hampered by the orientation and cabling of the other drives.

Furthermore, typical external drive peripheral connections and cables are located at the rear of such external drives, e.g. for tape, CD, DVD, floppy and hard drives. Access is therefore difficult for such drives even after the computer cover is removed.

Because of such difficulties of access to computer drives, in the past users have often been faced with having to make blind connections and in many cases, to navigate their hand through narrow sheetmetal openings. In addition to resulting in inefficiency in installation, maintenance and upgrading of computer drives, poor user accessibility to computer drives in the past has lead to improper connections, damaged components and even injury to the user.

What is needed is an improved method of mounting drives in a computer system that allows for easy and fast access to the drives and to their connections for installation, maintenance, upgrading and other purposes.

SUMMARY OF THE INVENTION

It is therefore an object of the present invention to provide an improved drive mounting system which is capable of housing multiple drives within a limited centralized area while also providing quick and easy access to the drives, and in particular the rear of the drives, when necessary. It is a further object of this invention to provide such an improved drive mounting system with a minimum of parts, for economy and ease of construction.

The present invention discloses an improved drive cage mounting bracket apparatus for mounting multiple storage drives, the bracket hingedly connected to the computer chassis to rotate about an axis in the plane of the drives, whereby the entire bracket with mounted drives may be rotated into an open position that presents easy access to the drives and particularly to the rear of the drives.

BRIEF DESCRIPTION OF THE DRAWINGS

Other objects, advantages, features and characteristics of the present invention, as well as methods, operation and function of related elements of structure, and the combination of parts and economies of manufacture, will become apparent upon consideration of the following description and claims with reference to the accompanying drawings, all of which form a part of this specification, wherein like reference numerals designate corresponding parts in the various figures, and wherein:

DETAILED DESCRIPTION OF THE PREFERRED EMBODIMENTS

In the following detailed description of the preferred embodiments, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that changes may be made without departing from the spirit or scope of the invention. To avoid detail not necessary to enable those skilled in the art to practice the invention, the description may omit certain information known to those skilled in the art. The following description is, therefore, not to be taken in a limiting sense, and the scope of the invention is defined only by the appended claims.

Figure 1:
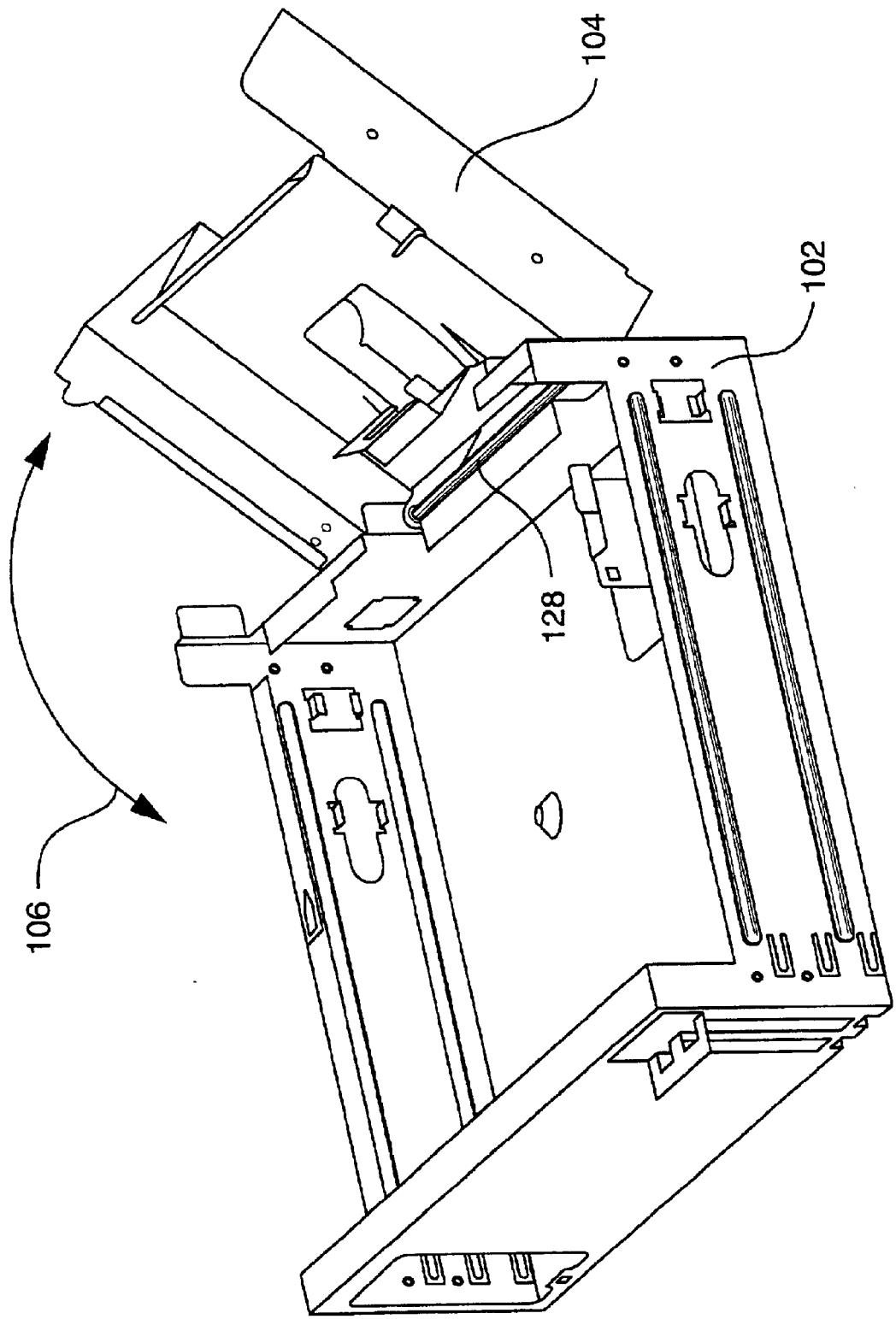
FIG. 1 is a perspective view of the present invention, showing the drive cage mounting bracket in the open position without mounted drives.
Figure 2:
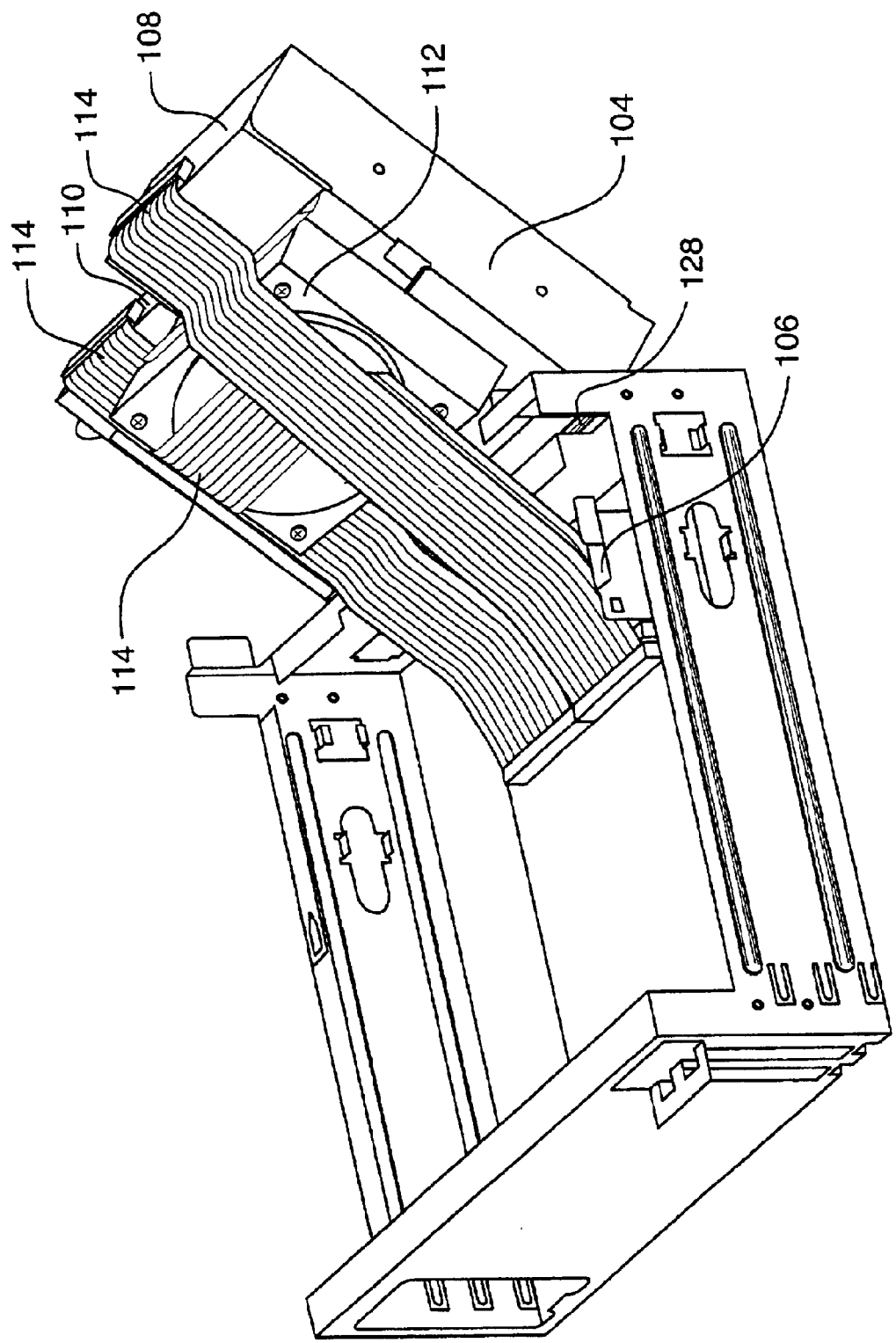
FIG. 2 is a perspective view of the present invention in the open position showing typically cabled drives mounted therein.

Referring now to FIGS. 1 and 2, the present invention comprises a bracket 104 for holding the drives, hingedly connected to computer chassis 102 by way of hinge pin 128. Referring to FIG. 2, in which are illustrated a CD-ROM/DVD drive 108, a 3½ inch diskette drive 110 and a hard drive 112 mounted within bracket 104, it will be noted that the hinge axis running along hinge pin 128 is advantageously parallel to the plane of drives 108, 110 and 112. Therefore, bracket 104 swings perpendicularly to the plane of drives 108, 110 and 112, as indicated by arrow 106, thereby in the open position allowing easy access to drives 108, 110 and 112 generally.

Furthermore, because bracket 104 is hinged at pin 128 advantageously toward the front of CD-ROM/DVD drive 108 and 3½ inch diskette drive 110, by opening bracket 104, the user particularly exposes the backs of drives 108 and 110, thereby obtaining easy access to connectors 114 thereon disposed. In certain preferred embodiments as illustrated, hard drive 112 is advantageously mounted distally from hinge pin 128, stacked with CD-ROM/DVD drive 108, and advantageously disposed so that the back side of hard drive 112 is orthogonal to the back side of CD-ROM/DVD drive 108. The distal mounting of hard drive 112 facilitates accessibility, while orienting hard drive 112 so that its back is orthogonal to the back of CD-ROM/DVD drive 108 reduces the likelihood that cables 114 from one of drives 108 and 112 will hinder access to the other drive or its cables 114.

As is well known among those of ordinary skill in the art, while all types of storage drives generate waste heat in operation, removal of such waste heat is of most critical importance for hard drives, in general the most thermally sensitive of storage drives. In preferred embodiments, hard drive 112 is mounted on bracket 104 so that when bracket 104 is in the closed, operational position, hard drive 112 is disposed below CD-ROM/DVD drive 108, with the underside of hard drive 112 advantageously largely exposed to air within chassis 102. The exposed underside of hard drive 112 in these embodiments facilitates heat transfer and efficient cooling of the hard drive by the air that is transported by the system fan (not shown) within chassis 102.

Turning to the construction of the invention in its preferred embodiments, bracket 104 is formed of a single sheet of metal, in the preferred embodiment SECC 0.8 gauge zinc-coated, cold-rolled steel. Design features of bracket 104 are implemented by bending, press-cutting, drilling and punching. In this embodiment, CD-ROM/DVD drive 108 is retained side-by-side with diskette drive 110 within bracket 104. For retaining drives 108 and 110, bracket 104 is fashioned in a form resembling a square sideways "S", with one drive mounted in one curve of the "S" and the other drive mounted in the other curve. The bracket 104 thereby surrounds each drive 108, 110, and 112 on three sides. In this embodiment, diskette drive 110 is surrounded on its top and two smaller sides, while CD-ROM/DVD drive 108 is surrounded on its bottom and two smaller sides.

Figure 3:
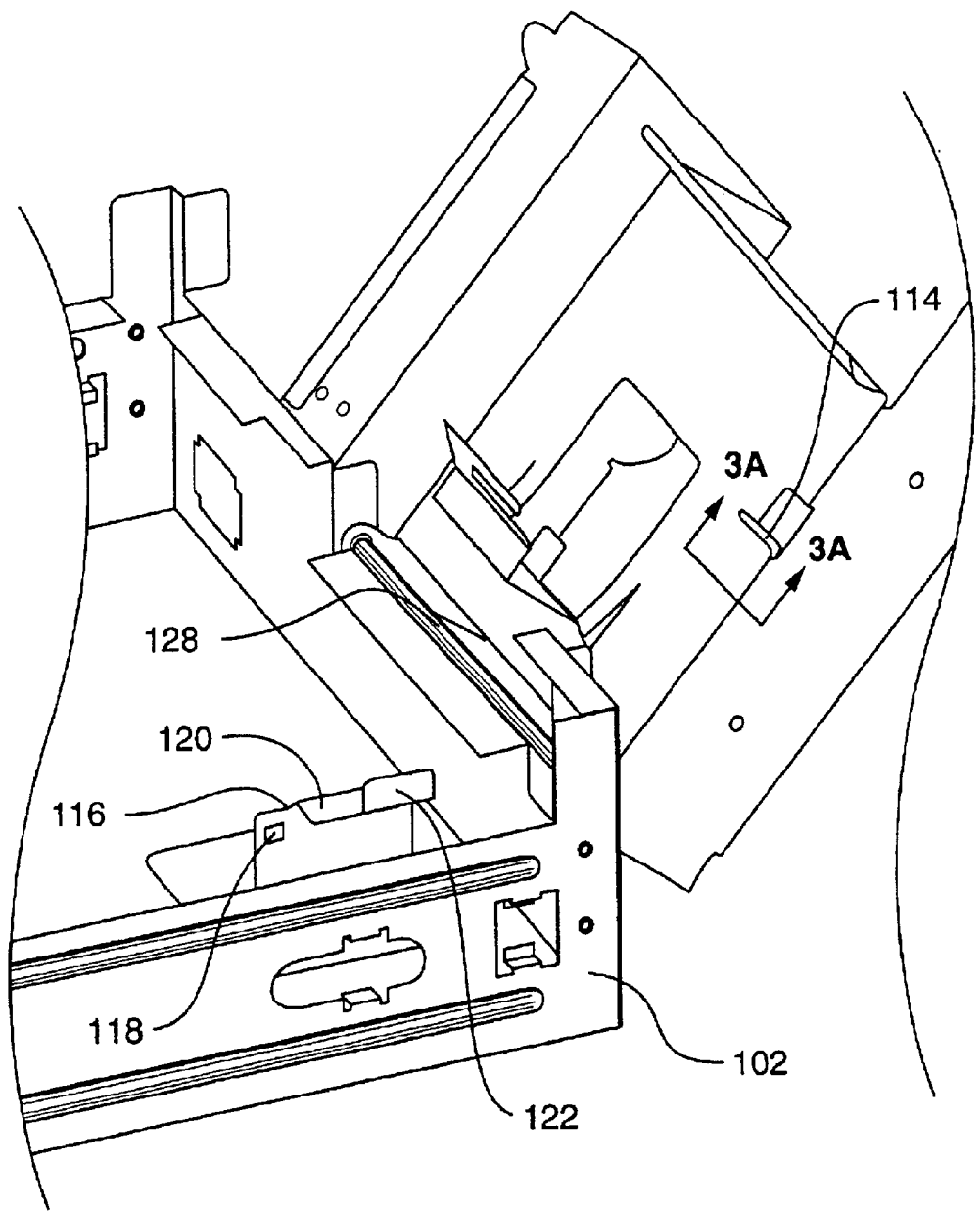
FIGS. 3 and 3A are close-up perspective views of the present invention in the open position without mounted drives.
Figure 3A:
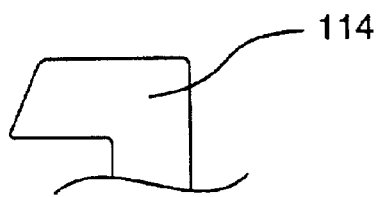

Advantageously, to secure bracket 104 in the closed position, supporting and locking element 116 is provided, as shown in FIG. 3. In some embodiments, element 116 is secured to chassis 102, in a preferred embodiment integrally as a metal piece punched, bent and formed from the sheet metal of chassis 102 itself. In some embodiments, supporting and locking element 116 may be secured to chassis 102 in such a way as to permit a certain amount of biased flexing of element 116 with respect to chassis 102, as further described below.

In these embodiments, supporting and locking element 116 supports bracket 104 by presenting surface 120 upon which the bottom of bracket 104 rests in the closed position. Secured upon bracket 104 is locking tooth 114, in the preferred embodiment integrally as a metal piece punched, bent and formed from the sheet metal of bracket 104 itself. Disposed within supporting and locking element 116 is aperture 118 so aligned as to receive locking tooth 114 of bracket 104 when bracket 104 is in the closed position, thereby retaining bracket 104 from hingedly opening from the closed position. In preferred embodiments that permit element 116 to flex under bias with respect to chassis 102, to release locking tooth 114 from engagement with aperture 118 and thereby unlock the bracket for hingedly opening, a user grasps a planar surface 122 of supporting and locking element 116, pulling it upward and inward against bias. This pull causes supporting and locking element 116 to flex, moving aperture 118 away from engagement with locking tooth 114 of bracket 104, thereby freeing bracket 104 to be hingedly opened.

As will be appreciated by those skilled in the art, other means may be employed for supporting and releaseably locking bracket 104. In contrast to the embodiments described above, supporting function may be provided by an element that is physically discrete from the element providing the locking function. The element supplying the supporting function and/or the locking function may be integral to chassis 102, bracket 104 or to the overall hinge mechanism, or, in the alternative, such element may be a discrete component affixed thereto. Any structure that serves to stop pivoting of bracket 104 when it is in the closed position can serve the supporting function. Such structures, well known to those skilled in the art, include tabs, pins or platforms relatively fixed with respect to chassis 102. In the alternative, such structures may comprise mechanisms of the hinge that retard pivoting past a certain point, such as a camming of the hinge. In addition, a diverse variety of locking mechanisms of varying degrees of complexity and functionality are available in the art for providing locking function, including bolts, engaging cams, locking detents, and all other means of releaseably locking one component to another known to those of skill in the art.

Figure 4:
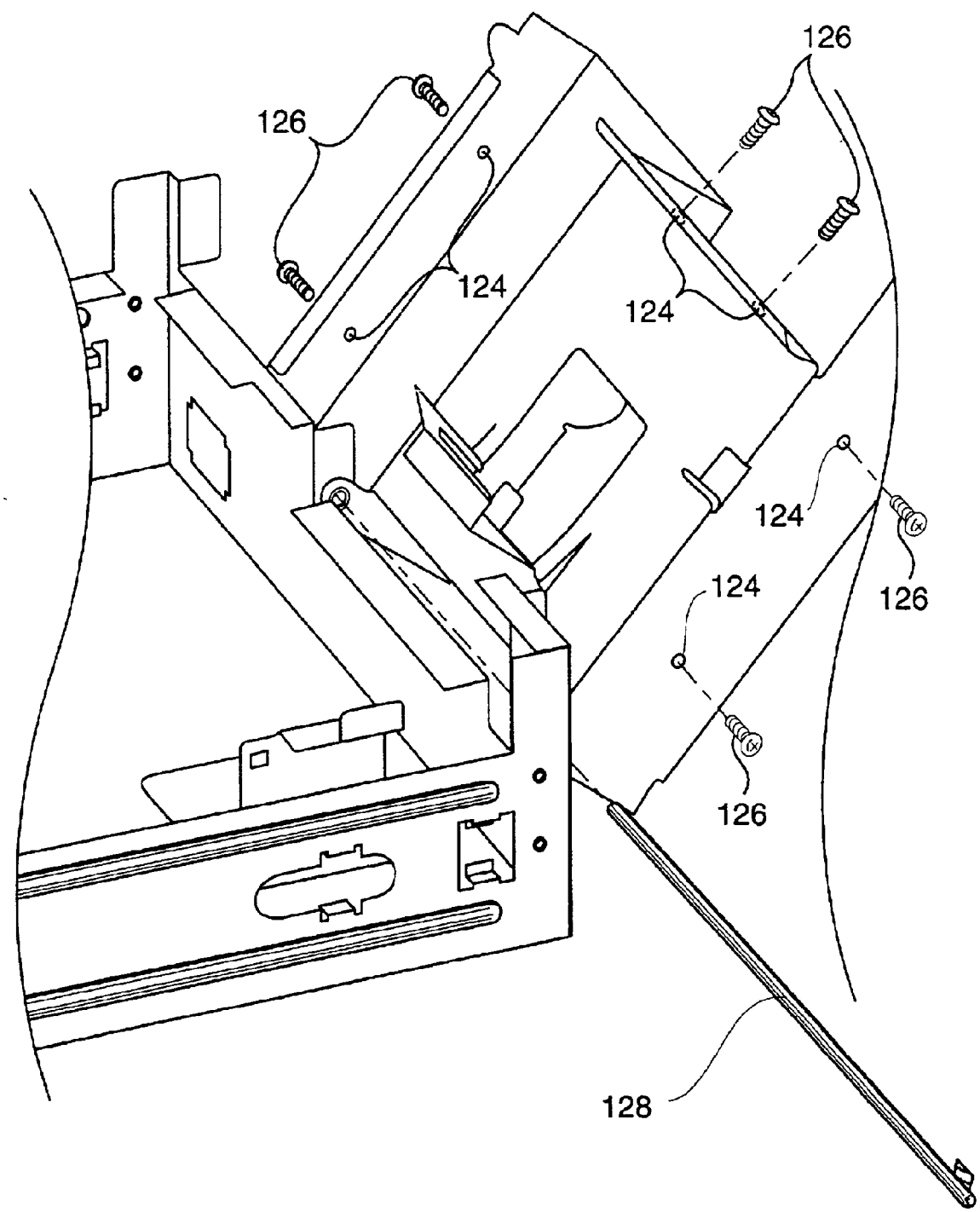
FIG. 4 is an exploded perspective view of the present invention in the open position, showing the means of mounting drives and hinge mechanism.

Turning now to the manner of securing drives 108, 110 and 112 within bracket 104, and referring to FIG. 4, mounting holes 124 are disposed within bracket 104 to align with mounting screw holes provided in drives 108, 110 and 112. In a manner well known to those in the art, the drives 108, 110 and 112 are secured within bracket 104 by way of screws 126 inserted through holes 124 to engage matching mounting screw holes in drives 108, 110 and 112. Because of the three-sided enclosure of each drive by bracket 104 in the preferred embodiment, screws 126 on only one side of each drive are sufficient to secure drives 108, 110 and 112 to bracket 104.

Figure 5:
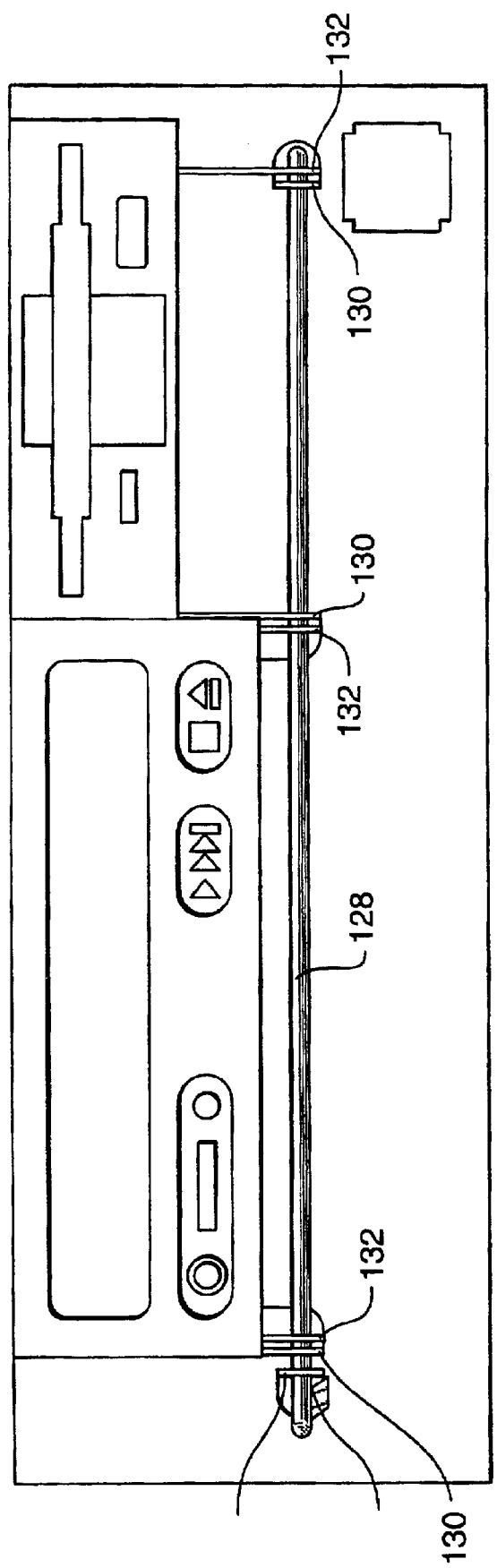
FIG. 5 is a plane view of the hinge mechanism of the present invention.

Turning now to the hinge mechanism of the present invention, a hinge is provided comprising a substantially rod-shaped hinge member 128, that in the preferred embodiment is composed of a high strength, flexible plastic material such as nylon. As shown in FIG. 5, the hinge rod is inserted through matching aligned hinge points 130, 136 on chassis 102 and hinge points 132 on bracket 104, and in the embodiment shown is secured by engagement of biased flexible toothed portion 134, which has been flexibly inserted through hinge point 136 on chassis 102, thereafter engaging at said hinge point 136 by bias of toothed portion 134. By allowing pivoting at hinge points 130, 132, 136 about hinge 128, the mechanism permits bracket 104 to rotate about the axis of hinge 128.

Although the invention has been described with a certain degree of particularity, it should be recognized that elements thereof may be altered by persons skilled in the art without departing from the spirit and scope of the invention. Accordingly, the present invention is not intended to be limited to the specific forms set forth herein, but on the contrary, it is intended to cover such alternatives, modifications and equivalents as can be reasonably included within the scope of the invention. The invention is limited only by the following claims and their equivalents.

What is claimed is:

1. An electronic system comprising:

a chassis having a front plane for orienting toward a user during use of the system and a rear plane for orienting away from the user during use;

a bracket for mounting two or more devices to said chassis;

a hinge rotatably connecting said bracket to said chassis, said hinge being configured to rotate said bracket about a hinging axis between an open position and a closed position; and wherein the closed position of said bracket being characterized by said bracket being located between the front plane and the rear plane of said chassis, the open position of said bracket being characterized by said bracket being located forwardly of the front plane of said chassis.

2. The system of claim 1 wherein said hinging axis extends in the front plane of said chassis.

3. The system of claim 1 wherein said bracket moves through the front plane of said chassis when moving from said closed position toward said open position.

4. The system of claim 1 wherein said hinging axis is oriented substantially parallel to the front plane of said chassis.

5. The system of claim 1 wherein said hinging axis lies in the front plane of said chassis.

6. The system of claim 1 wherein the front plane and the rear plane of said chassis are substantially parallel.

7. The system of claim 1 additionally comprising a pair of devices mounted on said bracket, each of said devices of said pair of devices having a connector receiving end.

8. The system of claim 7 wherein each device of said pair of devices has a media receiving end located opposite of said connector receiving end, said media receiving ends of said devices being positioned in said front plane of said chassis.

9. The system of claim 7 wherein said pair of devices is mounted. On said bracket such that moving said bracket from the closed position to the open position raises said connector receiving ends of said devices of said pair of devices above a remainder portion of said devices.

10. The system of claim 7 wherein at least a first device of maid pair of devices has a media receiving end located opposite of the connector receiving end of the first device, and wherein said pair of devices is mounted on said bracket such that moving said bracket from the closed position to the open position raises the connector receiving end of said first device above a level of said media receiving end.

11. The system of claim 1 additionally comprising means for securing said bracket in the closed position.

12. The system of claim 1 wherein the chassis includes a front wall extending in said front plane, a rear wall extending in said rear plane, and a pair of side walls extending between said front wall and said rear wall.

13. The system of claim 1 wherein each device of said pair of devices comprises a storage device.

14. The system of claim 1 wherein the chassis includes a front wall extending in said front plane, a rear wall extending in said rear plane, and a pair of side walls extending between said front wall and said rear wall; wherein said hinging axis lies in the front plane of said chassis; wherein said bracket move, through the front plane of said chassis when moving from said closed position toward said open position; wherein the front plane and the rear plane of said chassis are substantially parallel; a pair of device: being mounted on said bracket, each of said devices of said pair of devices having a connector receiving end, at least a first device of said pair of devices having a media receiving end located opposite of the connector receiving end of the first device, wherein said pair of devices is mounted on said bracket such that moving said bracket from the closed position to the open position raises the connector receiving end of said first device above a level of said media receiving end; and means for securing said bracket in the closed position.

\* \* \* \* \*